(12) United States Patent
Yang

(10) Patent No.: US 10,388,212 B2
(45) Date of Patent: Aug. 20, 2019

(54) ORGANIC LIGHT EMITTING DIODE DISPLAY WITH TRANSPARENT PIXEL PORTION AND CORRESPONDING DEVICES

(71) Applicant: Motorola Mobility LLC, Chicago, IL (US)

(72) Inventor: Ye Yang, Prior Lake, MN (US)

(73) Assignee: Motorola Mobility LLC, Chicago, IL (US)

( * ) Notice: Subject to any disclaimer, the term of this patent is extended or adjusted under 35 U.S.C. 154(b) by 0 days.

(21) Appl. No.: 15/620,001

(22) Filed: Jun. 12, 2017

(65) Prior Publication Data

US 2018/0357952 A1   Dec. 13, 2018

(51) Int. Cl.
*H01L 29/08* (2006.01)
*G09G 3/3208* (2016.01)
*H04N 5/225* (2006.01)
*H01L 27/32* (2006.01)
*H04N 5/232* (2006.01)

(52) U.S. Cl.
CPC ......... *G09G 3/3208* (2013.01); *H01L 27/323* (2013.01); *H01L 27/3211* (2013.01); *H01L 27/3234* (2013.01); *H04N 5/2257* (2013.01); *H04N 5/232* (2013.01); *G09G 2300/023* (2013.01); *G09G 2300/0452* (2013.01); *G09G 2300/0456* (2013.01); *G09G 2320/029* (2013.01); *G09G 2320/0233* (2013.01); *G09G 2330/021* (2013.01); *H01L 2251/5315* (2013.01); *H01L 2251/5323* (2013.01); *H01L 2251/568* (2013.01)

(58) Field of Classification Search
CPC ............. H01L 27/3206; H01L 27/3225; H01L 2251/53; H01L 2251/5307; H01L 2227/32; H01L 27/3241; H01L 27/3244; G09G 3/3208; G09G 2300/04
See application file for complete search history.

(56) References Cited

U.S. PATENT DOCUMENTS

| 8,363,301 | B2 | 1/2013 | Lee et al. | |
|---|---|---|---|---|
| 8,395,571 | B2* | 3/2013 | Kim | G09G 3/3208 345/83 |
| 8,410,683 | B2* | 4/2013 | Song | H01L 27/3211 313/504 |
| 8,659,512 | B2* | 2/2014 | Hae-Yeon | H01L 51/5265 257/72 |
| 9,236,419 | B2* | 1/2016 | Kim | H01L 51/5218 |
| 9,619,060 | B2 | 4/2017 | Suh et al. | |
| 2007/0146251 | A1* | 6/2007 | Tsuge | G09G 3/3233 345/76 |
| 2010/0066651 | A1* | 3/2010 | Lee | H01L 27/3211 345/76 |
| 2012/0098415 | A1* | 4/2012 | Song | H01L 27/3213 313/504 |
| 2016/0336530 | A1* | 11/2016 | Zhang | H01L 51/5218 |
| 2017/0017824 | A1* | 1/2017 | Smith | G02B 5/208 |
| 2017/0150085 | A1 | 5/2017 | Mishiguchi | |

* cited by examiner

*Primary Examiner* — Hsien Ming Lee
(74) *Attorney, Agent, or Firm* — Philip H. Burns, IV

(57) ABSTRACT

An organic light emitting diode display includes a substrate. The substrate defines a first pixel portion and one or more second pixel portions. Pixels formed in the first pixel portion include at least some transparent organic light emitting diode pixels, while other pixels formed in the one or more second pixel portions include only reflective organic light emitting diode pixels.

20 Claims, 12 Drawing Sheets

ORGANIC LIGHT EMITTING DIODE DISPLAY WITH TRANSPARENT PIXEL PORTION AND CORRESPONDING DEVICES

BACKGROUND

Technical Field

This disclosure relates generally to displays, and more particularly to displays for electronic devices.

Background Art

Portable electronic devices, such as smartphones and tablet computers, are ubiquitous in modern society. While mobile phones were once used only for making calls while "on the go," they are now used for countless activities other than making voice calls. These activities include sending and receiving text and multimedia messages, executing and managing financial transactions, consuming video and other multimedia content, and surfing the web.

There is a tension in the design of electronic devices between maximizing the size of a display upon which information is presented and keeping the overall size of the device such that it can economically and reasonably be held in the hand of a user. It would be advantageous to have an improved display, and corresponding device, that allowed the area of the display to increase without increasing the overall size of the device.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present disclosure.

Figure 1:
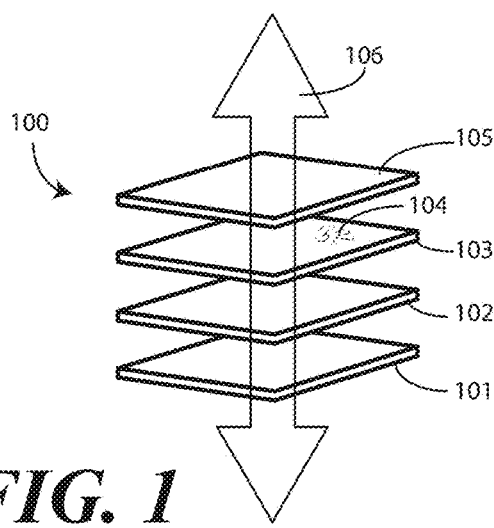
FIG. 1 illustrates one explanatory transparent organic light emitting diode pixel configured in accordance with one or more embodiments of the disclosure.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

DETAILED DESCRIPTION OF THE DRAWINGS

Before describing in detail embodiments that are in accordance with the present disclosure, it should be observed that the embodiments reside primarily in combinations of method steps and apparatus components related to organic light emitting diode displays configured in accordance with embodiments of the disclosure and methods of controlling and remediating the same. Any process descriptions or blocks in flow charts should be understood as representing modules, segments, or portions of code that include one or more executable instructions for implementing specific logical functions or steps in the process. Alternate implementations are included, and it will be clear that functions may be executed out of order from that shown or discussed, including substantially concurrently or in reverse order, depending on the functionality involved. Accordingly, the apparatus components and method steps have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein.

Embodiments of the disclosure do not recite the implementation of any commonplace business method aimed at processing business information, nor do they apply a known business process to the particular technological environment of the Internet. Moreover, embodiments of the disclosure do not create or alter contractual relations using generic computer functions and conventional network operations. Quite to the contrary, embodiments of the disclosure employ methods that, when applied to electronic device and/or user interface technology, improve the functioning of the electronic device itself by and improving the overall user experience to overcome problems specifically arising in the realm of the technology associated with electronic device user interaction.

It will be appreciated that embodiments of the disclosure described herein may be comprised of one or more conventional processors and unique stored program instructions that control the one or more processors to implement, in conjunction with certain non-processor circuits, some, most, or all of the functions of operating an organic light emitting diode display as described herein. The non-processor circuits may include, but are not limited to, a radio receiver, a radio transmitter, signal drivers, clock circuits, power source circuits, and user input devices. As such, these functions may be interpreted as steps of a method to perform operating and remediating steps for one or more organic light emitting diode displays configured in accordance with one or more embodiments of the disclosure. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

Embodiments of the disclosure are now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on." Relational terms such as first and second, top and bottom, and the like may be used solely to distinguish one entity or action from another entity or action without necessarily requiring or implying any actual such relationship or order between such entities or actions.

As used herein, components may be "operatively coupled" when information can be sent between such components, even though there may be one or more intermediate or intervening components between, or along the connection path. The terms "substantially" and "about" are used to refer to dimensions, orientations, or alignments inclusive of manufacturing tolerances. Thus, a "substantially orthogonal" angle with a manufacturing tolerance of plus or minus two degrees would include all angles between 88 and 92, inclusive. Also, reference designators shown herein in parenthesis indicate components shown in a figure other than the one in discussion. For example, talking about a device (10) while discussing figure A would refer to an element, 10, shown in figure other than figure A.

Embodiments of the disclosure provide one or more organic light emitting diode displays for electronic devices that allow imagers, sensors, and other components to be arranged beneath portions of the display, yet still receive and/or transmit light and other electromagnetic signals through the display. In one or more embodiments, the display integrates transparent organic light emitting diode display pixels, sub-pixels, or partial sub-pixels into an arrangement of reflective organic light emitting diode display pixels to provide portions of the display that are transparent or partially transparent. Sensors, such as an imager, can then be situated beneath the portions of the display that include the transparent organic light emitting diode display pixels, sub-pixels, or partial sub-pixels so as to receive light or other signals through the transparent or partially transparent portions of the display.

Advantageously, locating the imager and other sensors beneath the transparent or partially transparent portions of the display allows these devices to be concealed while still maintaining the ability to present information on the transparent or partially transparent portions of the display. This allows the area upon which information is presented to become larger, without requiring a larger form factor for the overall device. The transparent organic light emitting diode display pixels, sub-pixels, or partial sub-pixels can be configured along a substrate of the display by various techniques, including roll integration, pixel integration, partial hybrid sub-pixel integration, or other techniques.

In one or more embodiments, a predefined area is defined along the display. This predefined area can be at the top of the display, bottom of the display, sides of the display, or at other locations along the display. Imagers, lights for flash photography, proximity sensors, infrared sensors, or other sensors are then disposed beneath this predefined portion. Transparent organic light emitting diode display pixels, sub-pixels, or partial sub-pixels are then used in this predefined area, either with or without reflective organic light emitting diode display pixels, sub-pixels, or partial sub-pixels. The use of the transparent organic light emitting diode display pixels, sub-pixels, or partial sub-pixels in the predefined area allows the sensors to receive light, infrared signals, or other signals through the predefined area.

In one or more embodiments, the sensors can be controlled and synchronized with the operation of the display to achieve a time-sequential operation. Illustrating by example, when the imager is capturing an image, the predefined portion of the display can be turned OFF to allow the imager to capture the image. Said differently, when the imager captures the image the transparent organic light emitting diode display pixels, sub-pixels, or partial sub-pixels can be turned OFF so that they do not deliver light to the imager while the image is captured.

Advantageously, embodiments of the disclosure allow for a "borderless" display that can extend across the entirety, or nearly the entirety, of a major surface of an electronic device. In prior art devices, the area of the display had to be smaller than the area of a major surface, e.g., the front, of an electronic device to accommodate forward facing cameras, proximity sensors, and other sensors. With embodiments of the present disclosure, such devices can be hidden behind the transparent or partially transparent portions of the display while maintaining key optical characteristics of the display.

Embodiments of the disclosure also provide methods for controlling and optionally remediating the display as well. Embodiments of the disclosure contemplate that transparent organic light emitting diode display pixels, sub-pixels, or partial sub-pixels can diminish in brightness sooner than do reflective organic light emitting diode display pixels, sub-pixels, or partial sub-pixels. Additionally, transparent organic light emitting diode display pixels, sub-pixels, or partial sub-pixels can suffer from "burn-in" issues more than do their reflective counterparts. In one or more embodiments, methods of remediating the display to ensure that transparent portions and reflective portions appear visibly similar in appearance are disclosed.

Illustrating by example, in one or more embodiments one or more processors operable with the display perform color tracking by monitoring how often the portion of the display comprising transparent organic light emitting diode display pixels, sub-pixels, or partial sub-pixels is ON relative to other portions comprising only reflective organic light emitting diode display pixels, sub-pixels, or partial sub-pixels. The one or more processors can calculate and store running averages of this "on pixel ratio" for all areas of the display. The one or more processors can then compensate for differences in this on pixel ratio to ensure consistent optical performance as seen by a viewer. Other techniques for remediating or compensating displays configured in accordance with embodiments of the disclosure will be described below. Still others will be obvious to those of ordinary skill in the art having the benefit of this disclosure.

In one or more embodiments, an organic light emitting diode display comprises a substrate. The substrate defines a first pixel portion and one or more second pixel portions. In one or more embodiments, the first pixel portion comprises a combination of transparent organic light emitting diode display pixels, sub-pixels, or partial sub-pixels and reflective organic light emitting diode display pixels, sub-pixels, or partial sub-pixels. The one or more second pixel portions then comprise only reflective organic light emitting diode display pixels, sub-pixels, or partial sub-pixels.

The transparent organic light emitting diode display pixels, sub-pixels, or partial sub-pixels and the reflective organic light emitting diode display pixels, sub-pixels, or partial sub-pixels can be arranged in various ways. In one embodiment, the transparent organic light emitting diode display pixels, sub-pixels, or partial sub-pixels and the reflective organic light emitting diode display pixels, sub-pixels, or partial sub-pixels are arranged in an alternating pattern. Illustrating by example, in one embodiment columns of transparent organic light emitting diode display pixels, sub-pixels, or partial sub-pixels can alternate with columns of reflective organic light emitting diode display pixels, sub-pixels, or partial sub-pixels. In another embodiment, the transparent organic light emitting diode display pixels, sub-pixels, or partial sub-pixels and the reflective organic light emitting diode display pixels, sub-pixels, or partial sub-pixels can be arranged in a checkerboard pattern. Other arrangements will be described below. Still others will be obvious to those of ordinary skill in the art having the benefit of this disclosure.

An imager or other sensors can then be collocated with the first pixel portion. Since the first pixel portion comprises transparent organic light emitting diode display pixels, sub-pixels, or partial sub-pixels, when the imager is collocated with the first pixel portion it is able to receive light through the transparent organic light emitting diode display pixels, sub-pixels, or partial sub-pixels. In one or more embodiments, the one or more processors can cause the transparent organic light emitting diode display pixels, sub-pixels, or partial sub-pixels to cease emitting light while actuating the imager. This allows images to be captured without interference from light emitted by the transparent organic light emitting diode display pixels, sub-pixels, or partial sub-pixels.

In one or more embodiments, the one or more processors can further remediate one or both of the first pixel portion and the second pixel portion to compensate for performance degradation of the transparent organic light emitting diode display pixels, sub-pixels, or partial sub-pixels in comparison to the reflective organic light emitting diode display pixels, sub-pixels, or partial sub-pixels. For instance, when the transparent organic light emitting diode display pixels, sub-pixels, or partial sub-pixels suffer from a greater loss of brightness or a greater discoloration than do the reflective organic light emitting diode display pixels, sub-pixels, or partial sub-pixels, the one or more processors can remediate these effects. The one or more processors can increase the power being delivered to the transparent organic light emitting diode display pixels, sub-pixels, or partial sub-pixels, alter the drive signals to the various colors of the transparent organic light emitting diode display pixels, sub-pixels, or partial sub-pixels, and so forth. Other remediation techniques will be described below. Still others will be obvious to those of ordinary skill in the art having the benefit of this disclosure.

Turning now to FIG. 1 illustrated therein is a transparent organic light emitting diode pixel 100 in accordance with one or more embodiments of the disclosure. While described as a "pixel" for ease illustration the same structure is used for smaller elements such as sub-pixels or partial sub-pixels as well.

A substrate 101 supports an anode 102, both of which are optically transparent. For instance, the substrate 101 can be glass or thermoplastic, while the anode 102 is an optically transparent material such as such as indium-tin oxide (In$_2$O$_3$-SnO$_2$). Disposed above the anode 102 is a transparent conductive layer 103, which has an emissive layer 104 disposed thereon. A cathode 105 is disposed above the emissive layer 104. As with the anode 102, the cathode 105 can be manufactured from an optically transparent material such as indium-tin oxide. It should be noted that the anode 102 and cathode 105 could be reversed.

When the transparent organic light emitting diode pixel 100 is turned OFF, the transparent structures of the substrate 101, the anode 102, the transparent conductive layer 103, and the cathode 105 are on the order of eighty-five percent transparent. By contrast, when the anode 102 and the cathode 105 apply an electric field to the emissive layer 104, it emits light 106 out of the top side of the transparent organic light emitting diode pixel 100.

Figure 2:
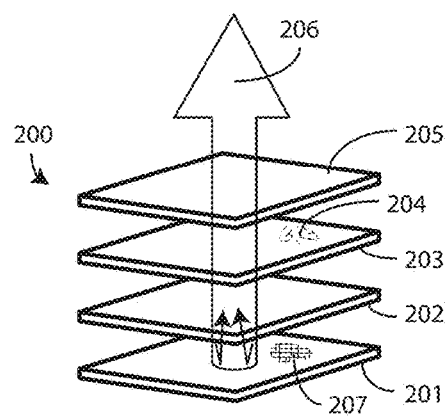
FIG. 2 illustrates one explanatory reflective organic light emitting diode pixel configured in accordance with one or more embodiments of the disclosure.

Turning now to FIG. 2, illustrated therein is a "reflective" organic light emitting diode pixel 200. As with the transparent organic light emitting diode pixel (100) of FIG. 1, while described as a "pixel" for ease illustration the same structure is used for smaller elements such as sub-pixels or partial sub-pixels as well.

The reflective organic light emitting diode pixel 200 is referred to as "reflective" because at least one of its layers is reflective rather than transparent. Illustrating by example, in one embodiment the substrate 201 includes a reflective material 207, such as a thin film or metal layer, which reflects light 206. Alternatively, one of the electrode layers can be reflective. For instance, the anode 202 can be manufactured from a reflective material, such as tin, gold, silver, or aluminum, rather than from an optically transparent material such as indium-tin oxide. The reflectivity of this electrode allows the light 206 to reflect from the anode 202. Where the anode 202 and cathode 205 are reversed, the cathode 205 can be reflective—or used with a reflective substrate—to form a reflective organic light emitting diode pixel 200.

As with the transparent organic light emitting diode pixel (100) of FIG. 1, the reflective organic light emitting diode pixel 200 of FIG. 2 includes a substrate 201 that supports an anode 202. A conductive layer 203, which is optically transparent, then supports an emissive layer 204. A cathode 205, also optically transparent, works with the anode 202 to apply an electric field to the emissive layer 204, thereby causing the emission of light 206 when the reflective organic light emitting diode pixel 200 of FIG. 2 is ON. When the reflective organic light emitting diode pixel 200 is OFF, it becomes reflective, opaque, or a combination thereof due to the fact that light does not pass through the reflective organic light emitting diode pixel 200.

The difference between the transparent organic light emitting diode pixel (100) of FIG. 1 and the reflective organic light emitting diode pixel 200 of FIG. 2 is that when the transparent organic light emitting diode pixel (100) is OFF, the transparent organic light emitting diode pixel (100) is optically transparent or pellucid. As used herein with reference to pixels, "optically transparent" means that more than fifty percent of the light incident upon a pixel will pass through the pixel with the pixel is OFF. The term is used this way to account for losses in the various layers of the pixel. For example, in one embodiment the transparent organic light emitting diode pixel (100) is at least 80% optically transparent. By contrast, when the reflective organic light emitting diode pixel 200 is OFF, light does not pass through its structure due to the use of opaque and/or reflective substrates and/or electrodes.

Figure 3:
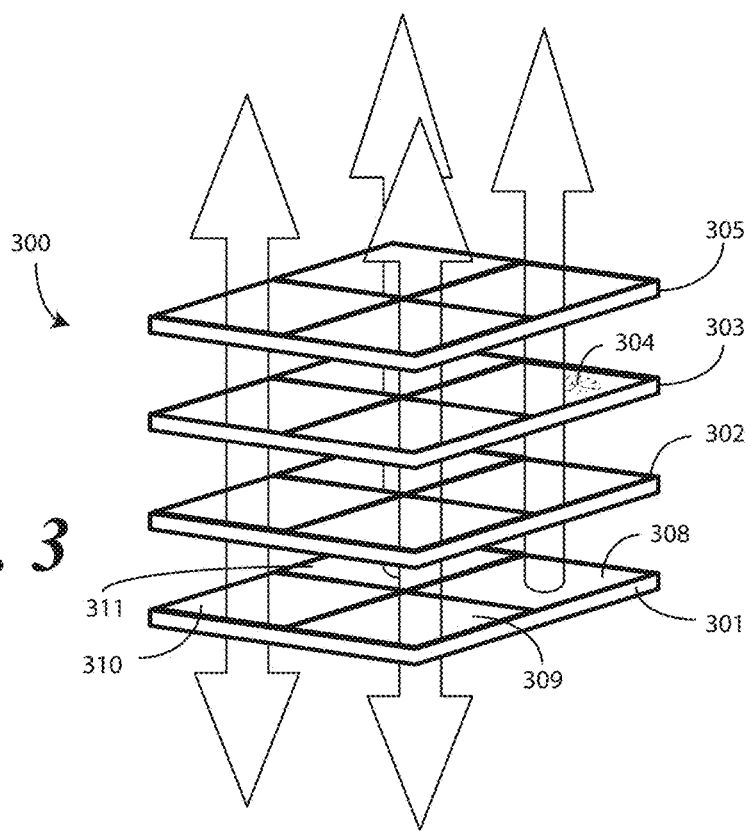
FIG. 3 illustrates another explanatory transparent organic light emitting diode pixel, which includes transparent sub-pixel portions and reflective sub-pixel portions, in accordance with one or more embodiments of the disclosure.

Turning now to FIG. 3, illustrated therein is another transparent organic light emitting diode pixel 300 configured in accordance with one or more embodiments. In this illustrative embodiment, the transparent organic light emitting diode pixel 300 includes one or more sub-pixels 308,309,310,311. Some of the sub-pixels, i.e., sub-pixels 309,310, are transparent organic light emitting diode sub-pixels, while other sub-pixels, i.e., sub-pixels 308,311, are reflective organic light emitting diode sub-pixels.

Despite the fact that the transparent organic light emitting diode pixel 300 includes one or more reflective organic light emitting diode sub-pixels, it is still considered to be a "transparent" organic light emitting diode pixel 300 because at least portions of the pixel are optically transparent. Accordingly, as used herein "transparent organic light emitting diode pixels" are pixels that are at least fifty percent optically transparent when in the OFF state, or that include at least one sub-pixel that is at least fifty percent optically transparent when in the OFF state. By contrast, "reflective organic light emitting diode pixels" are not optically transparent when in the OFF state.

As before, the transparent organic light emitting diode pixel 300 of FIG. 3 includes a substrate 301 that supports an anode 302. A conductive layer 303, which is optically transparent, then supports an emissive layer 304. A cathode 305, also optically transparent, works with the anode 302 to apply an electric field to the emissive layer 304, thereby causing the emission of light. One or more of the anode 302 or the substrate 301 includes a reflective material at sub-pixels 308,311. By contrast, both the substrate 301 and the anode 302 are optically transparent at sub-pixels 309,310.

Figure 4:
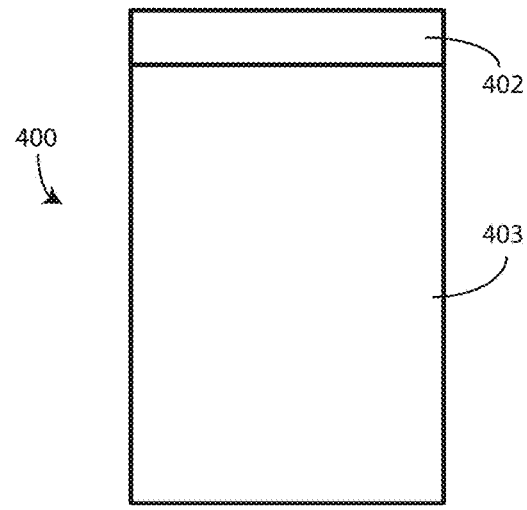
FIG. 4 illustrates one explanatory organic light emitting diode display configured in accordance with one or more embodiments of the disclosure.

Turning now to FIG. 4, illustrated therein is one explanatory display 400 configured in accordance with one or more embodiments of the disclosure. In one or more embodiments, the display 400 is an organic light emitting diode display comprising a substrate 401 defining a first pixel portion 402 and one or more second pixel portions 403. In the illustrative embodiment of FIG. 4, the one or more second pixel portions 403 are illustrated as a single pixel portion for ease of discussion. However, they could equally be two or more pixel portions as well. For example, the first pixel portion 402 could be moved to the middle of the display 400 with one second pixel portion disposed above the first pixel portion and another second pixel portion disposed below the first pixel portion. Other configurations will be obvious to those of ordinary skill in the art having the benefit of this disclosure.

In one embodiment, the first pixel portion 402 comprises only transparent organic light emitting diode pixels. For instance, in one embodiment the pixels disposed within the first pixel portion 402 are only the transparent organic light emitting diode pixels (100) from FIG. 1. Alternatively, in another embodiment the pixels disposed within the first pixel portion 402 are only the transparent organic light emitting diode pixels (300) from FIG. 3. Of course, a combination of the transparent organic light emitting diode pixels (100) from FIG. 1 and the transparent organic light emitting diode pixels (300) from FIG. 3 can be used as well.

In another embodiment, the pixels disposed in the first pixel portion 402 comprise a combination of transparent organic light emitting diode pixels and reflective organic light emitting diode pixels. For example, in one embodiment the pixels disposed in the first pixel portion 402 comprise a mixture of the transparent organic light emitting diode pixels (100) from FIG. 1 and the reflective organic light emitting diode pixels (200) of FIG. 2. In another embodiment, the pixels disposed in the first pixel portion 402 comprise a mixture of the transparent organic light emitting diode pixels (300) from FIG. 3 and the reflective organic light emitting diode pixels (200) of FIG. 2. Of course combinations of the transparent organic light emitting diode pixels (100) and the transparent organic light emitting diode pixels (300) can be used with the reflective organic light emitting diode pixels (200) of FIG. 2 as well. Other configurations will be described below with reference to FIGS. 5-9. Still others will be obvious to those of ordinary skill in the art having the benefit of this disclosure.

In contrast to the pixels disposed in the first pixel portion 402, pixels disposed in the one or more second pixel portions 403 comprise only reflective organic light emitting diode pixels. In one or more embodiments, there are no transparent organic light emitting diode pixels disposed in the one or more second pixel portions 403. It should be noted, however, that as is the case with one or more the second pixel portions 403, additional pixel portions that use transparent organic light emitting diode pixels can be defined within the one or more second pixel portions 403. Thus, in one or more embodiments there will be two or more first pixel portions 402 used with the one or more second pixel portions 403.

Figure 5:
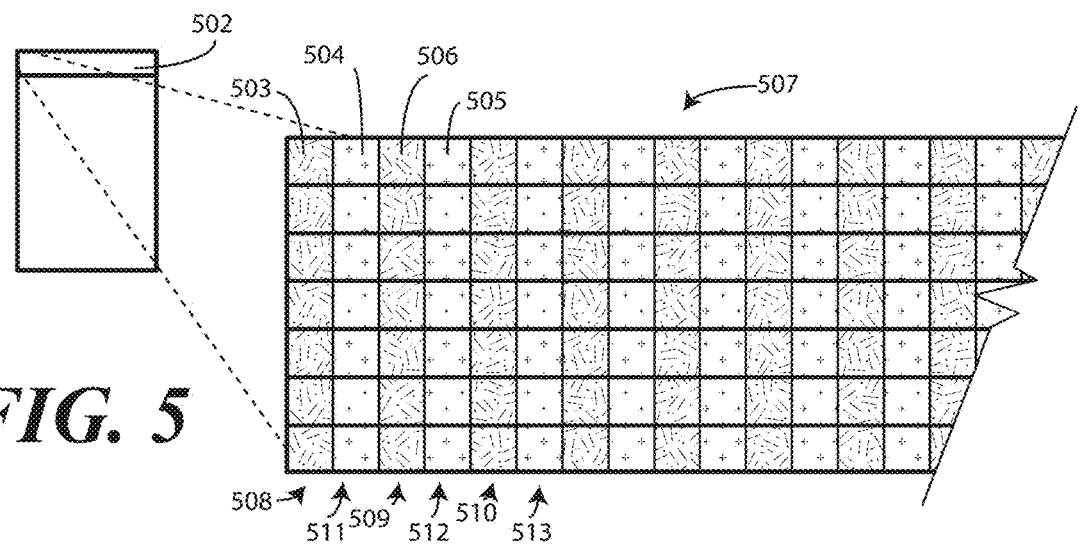
FIG. 5 illustrates one explanatory organic light emitting diode display configured in accordance with one or more embodiments of the disclosure.

Turning now to FIG. 5, illustrated therein is one embodiment of a first pixel portion 502 configured in accordance with one or more embodiments of the disclosure. In this illustrative embodiment, the first pixel portion 502 comprises a combination of transparent organic light emitting diode pixels, e.g., pixel 504, and reflective organic light emitting diode pixels, e.g., pixel 503.

In this illustrative embodiment, the transparent organic light emitting diode pixels and the reflective organic light emitting diode pixels of the first pixel portion are arranged in an alternating array 507. As used herein, "alternating" takes the dictionary meaning of "every other" or "every second." Thus, at least some transparent organic light emitting diode pixels occur in every other position, interspaced by at least one reflective organic light emitting diode pixel. Illustrating by example, pixel 504, which is a transparent organic light emitting diode pixel, and pixel 505, which is another transparent organic light emitting diode pixel, occur in every other position due to the fact that pixel 506, which is a reflective organic light emitting diode pixel is interspaced therebetween.

In the illustrative embodiment of FIG. 5, alternating array 507 comprises columns 508,509,510 of reflective organic light emitting diode pixels alternating with other columns 511,512,513 of transparent organic light emitting diode pixels. In another embodiment, the alternating array 507 could comprise rows of reflective organic light emitting diode pixels alternating with other rows of transparent organic light emitting diode pixels. Still other alternating arrays will be obvious to those of ordinary skill in the art having the benefit of this disclosure.

Figure 6:
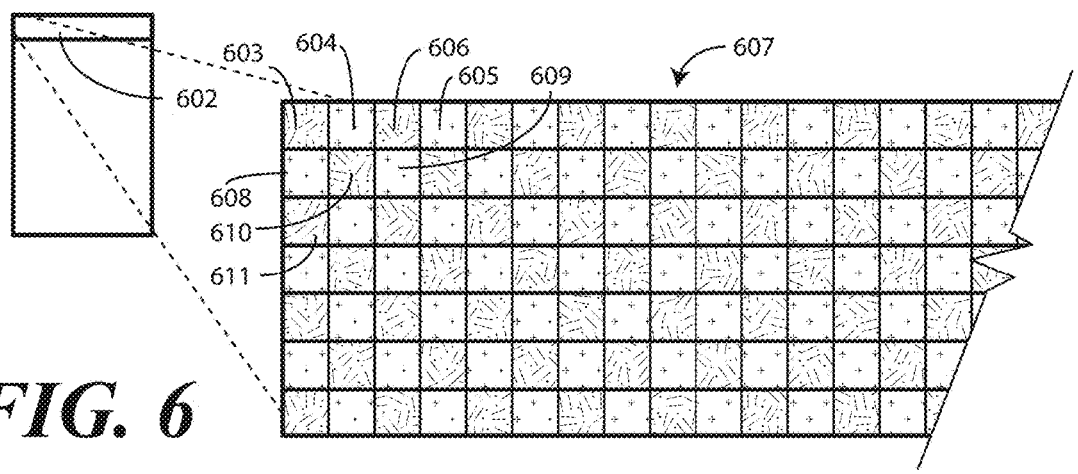
FIG. 6 illustrates another explanatory organic light emitting diode display configured in accordance with one or more embodiments of the disclosure.

Turning now to FIG. 6, illustrated therein is another embodiment of a first pixel portion 502 configured in accordance with one or more embodiments of the disclosure. As with the embodiment of FIG. 5, in FIG. 6 the first pixel portion 602 comprises a combination of transparent organic light emitting diode pixels, e.g., pixel 604, and reflective organic light emitting diode pixels, e.g., pixel 603. Also as before, the transparent organic light emitting diode pixels and the reflective organic light emitting diode pixels of the first pixel portion are arranged in another alternating array 607.

In this illustrative embodiment, the alternating array 607 comprises a checkerboard array. Accordingly, every other transparent organic light emitting diode pixel, e.g., pixels 604,605,608,609, alternate with reflective organic light emitting diode pixels 603,606,610,611 in both the vertical and horizontal directions. In this embodiment, two transparent organic light emitting diode pixels are interspaced with one reflective organic light emitting diode pixel, and vice versa. In other embodiments, two transparent organic light emitting diode pixels could be interspaced by two two-emitting organic light emitting diode pixels, and vice versa. Other checkerboard configurations will be obvious to those of ordinary skill in the art having the benefit of this disclosure.

Figure 7:
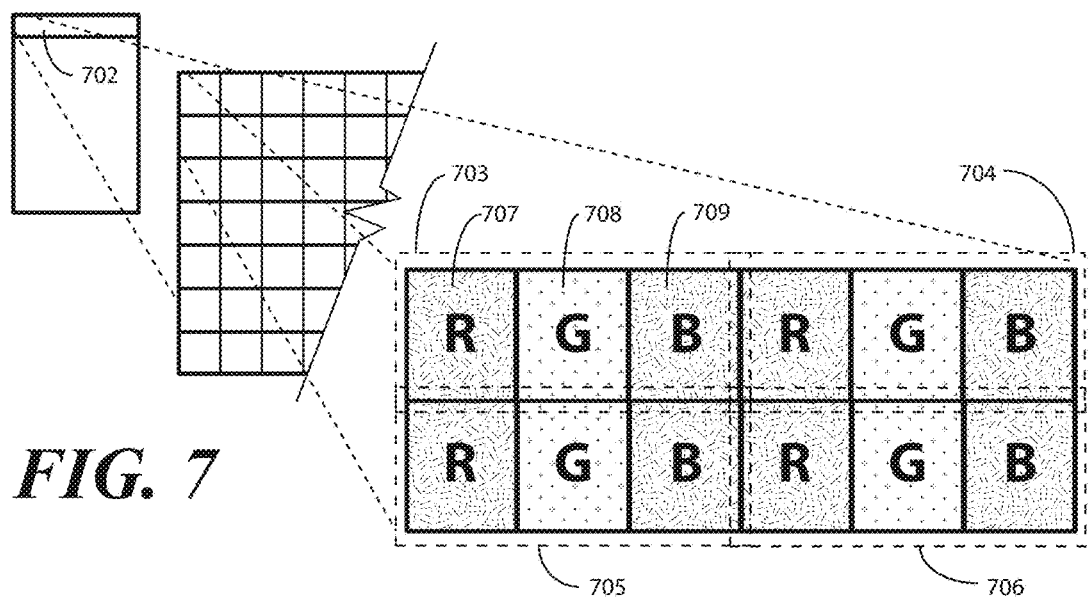
FIG. 7 illustrates another explanatory organic light emitting diode display configured in accordance with one or more embodiments of the disclosure.

Turning to FIG. 7, illustrated therein is another embodiment of a first pixel portion 702 configured in accordance with one or more embodiments of the disclosure. In this embodiment, the first pixel portion 702 comprises only transparent organic light emitting diode pixels. However, each transparent organic light emitting diode pixel includes a plurality of sub-pixels. Some of the sub-pixels are transparent organic light emitting diode sub-pixels, while other sub-pixels are reflective organic light emitting diode sub-pixels.

In the magnified view shown in FIG. 7, four pixels 703,704,705,706 are shown. Each pixel 704,705,706 includes three sub-pixels. For example, pixel 703 includes three sub-pixels 707,708,709, as do each of the other pixels 703,704,705,706. In this illustrative embodiment, sub-pixel 707 is a red sub-pixel. Sub-pixel 708 is a green sub-pixel, while sub-pixel 709 is a blue sub-pixel.

As shown in FIG. 7, some sub-pixels are transparent and other sub-pixels are reflective. Illustrating by example, in this illustrative embodiment the green sub-pixels, e.g., sub-pixel 708, comprise transparent organic light emitting diode sub-pixels, while the red sub-pixels and the blue sub-pixels, e.g., sub-pixels 707,709, are reflective organic light emitting diode sub-pixels.

Embodiments of the disclosure contemplate that when red, green, and blue sub-pixels are used in an organic light emitting device, green sub-pixels are generally the most efficient sub-pixels at converting current to light, while blue sub-pixels are generally the least efficient. Accordingly, in one or more embodiments, to achieve balance between the first pixel portion 702 and the one or more second pixel portions (403), the more efficient sub-pixels are designed to be transparent organic light emitting diode sub-pixels, while less efficient sub-pixels are designed to be reflective organic light emitting diode sub-pixels. Here, the green sub-pixels are designed to be transparent organic light emitting diode sub-pixels while the red sub-pixels and the blue sub-pixels are designed to be reflective organic light emitting diode sub-pixels.

Figure 8:
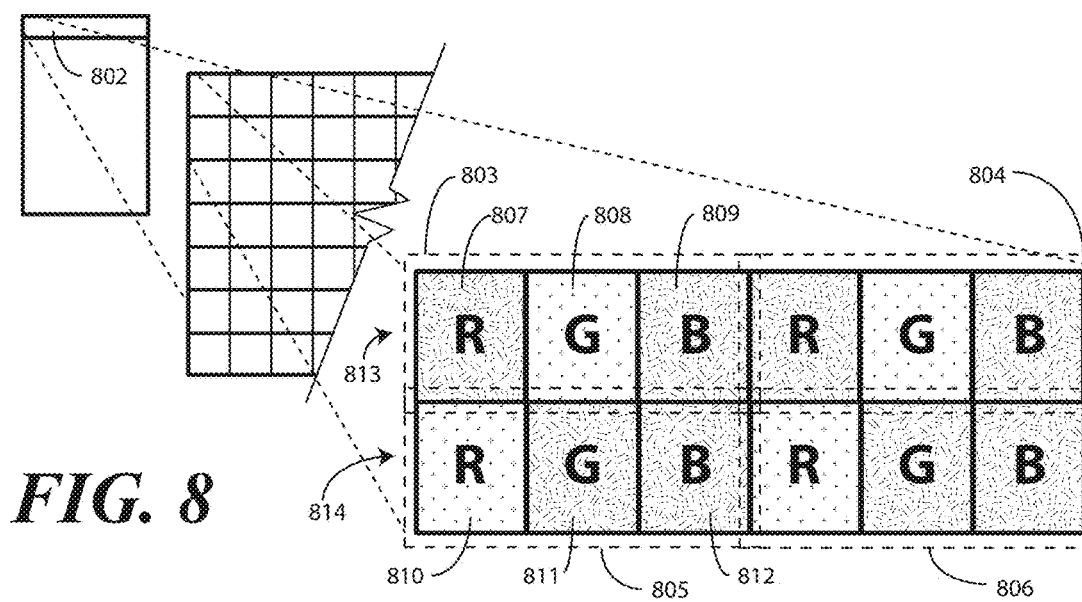
FIG. 8 illustrates yet another explanatory organic light emitting diode display configured in accordance with one or more embodiments of the disclosure.

Turning to FIG. 8, there is a variation of this design. In this embodiment, both red sub-pixels and green sub-pixels are designed to be transparent organic light emitting diode sub-pixels. In the magnified view shown in FIG. 8, four pixels 803,804,805,806 are shown. Each pixel 803,804,805, 806 again includes three sub-pixels. For example, pixel 803 includes three sub-pixels 807,808,809. Similarly, pixel 805 includes three sub-pixels 810,811,812, as do each of the other pixels 804,806. In this illustrative embodiment, sub-pixels 807,810 are red sub-pixels. Sub-pixels 808,811 are green sub-pixels, while sub-pixels 809,812 are blue sub-pixels.

As shown in FIG. 8, some sub-pixels are transparent and other sub-pixels are reflective. However, pixels in different locations are configured differently. Illustrating by example, in this illustrative embodiment the green sub-pixel of pixel 803, e.g., sub-pixel 808, comprises a transparent organic light emitting diode sub-pixel, while the red sub-pixel and the blue sub-pixel, e.g., sub-pixels 807,809, are reflective organic light emitting diode sub-pixels. By contrast, the red sub-pixel of pixel 805, e.g., sub-pixel 810, is a transparent organic light emitting diode sub-pixel, while the green sub-pixel and the blue sub-pixel, e.g., sub-pixels 811,812, are reflective organic light emitting diode sub-pixels.

In this illustrative embodiment, each pixel in a row 813,814 is configured the same. Accordingly, pixel 804 has the same configuration as pixel 803. Similarly, pixel 806 is configured the same as pixel 805. To provide an alternating array, the row below row 814 would have the same configuration as row 813, while the row above row 813 would have the same configuration as row 814. However, in other embodiments pixels in columns could have the same configuration, with those columns alternating, rather than having rows alternating in configuration. Other configurations will be obvious to those of ordinary skill in art having the benefit of this disclosure.

Figure 9:
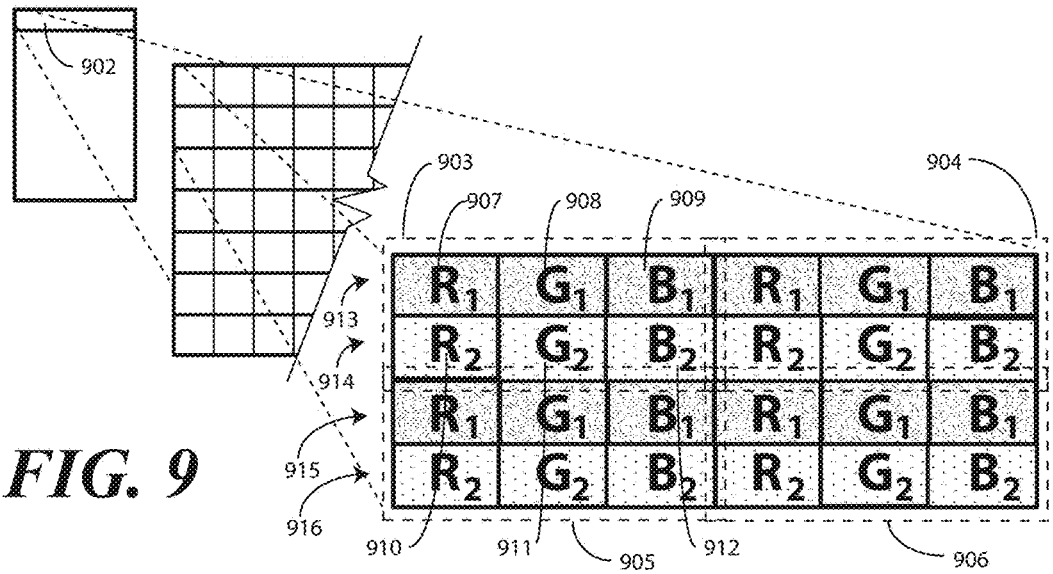
FIG. 9 illustrates still another explanatory organic light emitting diode display configured in accordance with one or more embodiments of the disclosure.

Turning now to FIG. 9, illustrated therein is yet another first pixel portion 902 configured in accordance with one or more embodiments of the disclosure. In the magnified view shown in FIG. 9, four pixels 903,904,905,906 are shown. Each pixel 903,904,905,906 includes six sub-pixels, with two sub-pixels being red, two sub-pixels being green, and two sub-pixels being blue.

Illustrating by example, pixel 903 includes six sub-pixels 907,908,909,910,911,912 as do each of the other pixels 904,905,906. In this illustrative embodiment, sub-pixels 907,910 are red sub-pixels. Sub-pixels 908,911 are green sub-pixels, while sub-pixel 909,912 are each blue sub-pixels.

As shown in FIG. 9, some sub-pixels are transparent and other sub-pixels are reflective. Illustrating by example, in this illustrative embodiment one of each of the red sub-pixels, the green sub-pixels, and the blue sub-pixels, e.g., sub-pixels 910,911,912, comprise transparent organic light emitting diode sub-pixels, while another of each of the red sub-pixels, green sub-pixels, and the blue sub-pixels, e.g., sub-pixels 907,908,909, are reflective organic light emitting diode sub-pixels.

Accordingly, in the embodiment of FIG. 9, for each pixel, each of a first red sub-pixel and a first green sub-pixel comprise transparent sub-pixels, while each of a second red sub-pixel and a second green sub-pixel comprises reflective sub-pixels. In this embodiment, all pixels are configured the same. However, the pixels are still in an alternating array since rows 913,914,915,916 of sub-pixels alternate.

Figure 10:
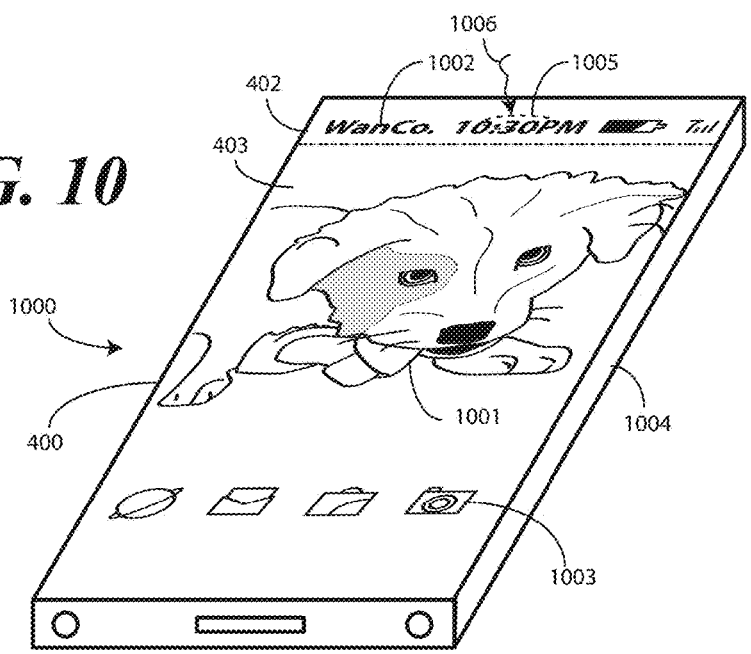
FIG. 10 illustrates one explanatory electronic device in accordance with one or more embodiments of the disclosure.

Turning now to FIG. 10, illustrated therein is an electronic device 1000 comprising the display 400 of FIG. 4. The display 400 includes a first pixel portion 402 and a second pixel portion 403. The first pixel portion 402 could be any of the first pixel portions (502,5602,702,802,902) of FIGS. 5-9, or could be of another configuration. In one embodiment, the first pixel portion 402 comprises only transparent organic light emitting diode pixels. In another embodiment, the pixels disposed in the first pixel portion 402 comprise a combination of transparent organic light emitting diode pixels and reflective organic light emitting diode pixels. Other configurations will be obvious to those of ordinary skill in the art having the benefit of this disclosure.

As shown in FIG. 10 the entire extent of the display 400 is available for presenting images 1001 to a user. Here, images 1001 and user actuation targets 1003 are presented on the second pixel portion 403, while device information 1002, such as battery status, time of day, and signal strength are presented on the first pixel portion 402. There is no need for the housing 1004 of the electronic device 1000 to include borders that picture frame the display 400. To the contrary, the display 400 can span an entire major face of the electronic device 1000 so that the entirety of the major face can be used as active display area.

One way this "borderless" display is achieved is by placing an imager 1005 and/or other sensors beneath the first pixel portion 402 such that the imager 1005 and/or other sensors are collocated with the first pixel portion 402. This allows the imager 1005 and/or other sensors to receive signals 1006 through the transparent portions of the first pixel portion 402. Advantageously, the imager 1005 can take pictures through the first pixel portion 402, and thus need not to be adjacent to the display 400. This allows the display 400 to extend to the border of the top of the electronic device 1000 rather than requiring extra space for only the imager 1005.

Figure 11:
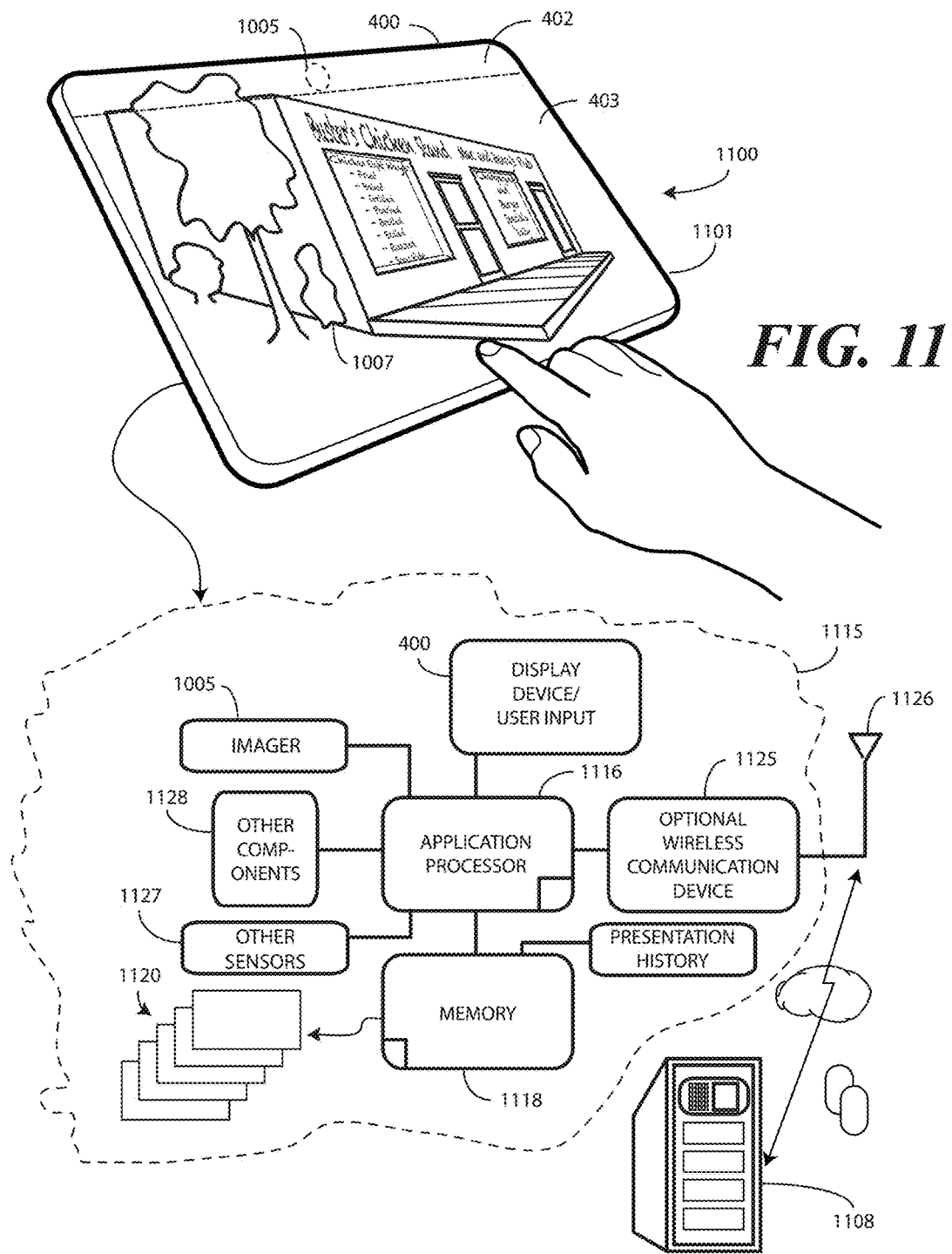
FIG. 11 illustrates another explanatory electronic device in accordance with one or more embodiments of the disclosure.

Turning now to FIG. 11, illustrated therein is another explanatory electronic device 1100 configured in accordance with one or more embodiments of the disclosure. The electronic device 1100 of FIG. 11 is a portable electronic device, and is shown operating as a tablet computer. This illustrative electronic device 1100 includes a display 400, which may optionally be touch-sensitive. In one embodiment where the display 400 is touch-sensitive, the display 400 can serve as a primary user interface of the electronic device 1100. Users can deliver user input to the display 400 of such an embodiment by delivering touch input from a finger, stylus, or other objects disposed proximately with the display.

In one embodiment, the display 400 comprises an organic light emitting diode display comprising a substrate defining a first pixel portion 402 comprising one or more transparent organic light emitting diode pixels. The first pixel portion 402 can comprise exclusively transparent organic light emitting diode pixels. Alternatively, the first pixel portion 402 can comprise a combination of transparent organic light emitting diode pixels and reflective organic light emitting diode pixels as previously described. The substrate of the display 400 also defines at least one second pixel portion 403 comprising only reflective light emitting diode pixels. The explanatory electronic device 1100 of FIG. 11 also includes a housing 1101 supporting the display 400.

A block diagram schematic 1115 of the electronic device 1100 is also shown in FIG. 11. In one embodiment, the electronic device 1100 includes one or more processors 1116. The one or more processors 1116 can include one or more processors. The one or more processors 1116 can be a microprocessor, a group of processing components, one or more Application Specific Integrated Circuits (ASICs), programmable logic, or other type of processing device. The one or more processors 1116 can be operable with the various components of the electronic device 1100. The one or more processors 1116 can be configured to process and execute executable software code to perform the various functions of the electronic device 1100. A storage device, such as memory 1118, can optionally store the executable software code used by the one or more processors 1116 during operation.

In one embodiment, the one or more processors 1116 are responsible for performing the primary functions of the electronic device 1100. For example, in one embodiment the one or more processors 1116 can comprise one or more circuits operable to present presentation information, such as images, text, and video, on the display 400, or portions thereof. The executable software code used by the one or more processors 1116 can be configured as one or more modules 1120 that are operable with the one or more processors 1116. Such modules 1120 can store instructions, control algorithms, and so forth. The modules 1120 can include an operating system environment, an application layer, an application service layer, and other layers.

In this illustrative embodiment, the electronic device 1100 also includes a communication circuit 1125 that can be configured for wired or wireless communication with one or more other devices or networks. The networks can include a wide area network, a local area network, and/or personal area network. Examples of wide area networks include GSM, CDMA, W-CDMA, CDMA-2000, iDEN, TDMA, 2.5 Generation 3GPP GSM networks, 3rd Generation 3GPP WCDMA networks, 3GPP Long Term Evolution (LTE) networks, and 3GPP2 CDMA communication networks, UMTS networks, E-UTRA networks, GPRS networks, iDEN networks, and other networks.

The communication circuit 1125 may also utilize wireless technology for communication, such as, but are not limited to, peer-to-peer or ad hoc communications such as HomeRF, Bluetooth and IEEE 802.11 (a, b, g or n), and other forms of wireless communication such as infrared technology. The communication circuit 1125 can include wireless communication circuitry, one of a receiver, a transmitter, or transceiver, and one or more antennas 1126.

As shown in FIG. 11, the one or more processors 1116 are presenting content 1107 on the display 400. The content 1107 of this illustration is a graphical image. In one or more embodiments, content 1107 is retrieved, using the communication circuit 1125, from one or more remote servers 1108.

In one or more embodiments, the electronic device 1100 includes an imager 1005. The imager 1005 can be an image capture device, such as a digital camera in one or more embodiments. As shown in FIG. 11, the imager 1005 is disposed beneath, and thus collocated with, the first pixel portion 402 of the display 400.

The electronic device 1100 can include other sensors 1127. The other sensors 1127 may include a microphone, an earpiece speaker, a loudspeaker, key selection sensors, a touch pad sensor, a touch screen sensor, a capacitive touch sensor, and one or more switches. Touch sensors may used to indicate whether any of the user actuation targets present on the display 400 are being actuated. Alternatively, touch sensors disposed in the housing 1101 can be used to determine whether the electronic device 1100 is being touched at side edges or major faces of the electronic device 1100 are being performed by a user. The touch sensors can include surface and/or housing capacitive sensors in one embodiment.

The other sensors 1127 can also include motion detectors, such as one or more accelerometers or gyroscopes. For example, an accelerometer may be embedded in the electronic circuitry of the electronic device 1010 to show vertical orientation, constant tilt and/or whether the electronic device 1100 is stationary. A gyroscope can be used in a similar fashion. In one embodiment the motion detectors are also operable to detect movement, and direction of movement, of the electronic device 1100 by a user.

As with the imager 1005, any of the other sensors 1127 that operate by receiving electromagnetic signals from sources external to the electronic device 1100 can be collocated with the first pixel portion 402 of the display 400. For example, a proximity detector that receives infrared signals can be disposed beneath the first pixel portion 402 of the display 400 to receive these signals through the transparent organic light emitting diode pixels as previously described.

Other components 1128 operable with the one or more processors 1116 can include output components such as video outputs, audio outputs, and/or mechanical outputs. Examples of output components include audio outputs, an earpiece speaker, haptic devices, or other alarms and/or buzzers and/or a mechanical output component such as vibrating or motion-based mechanisms. Still other components will be obvious to those of ordinary skill in the art having the benefit of this disclosure.

It is to be understood that FIG. 11 is provided for illustrative purposes only and for illustrating components of one electronic device 1100 in accordance with embodiments of the disclosure, and is not intended to be a complete schematic diagram of the various components required for an electronic device. Therefore, other electronic devices in accordance with embodiments of the disclosure may include various other components not shown in FIG. 11, or may include a combination of two or more components or a division of a particular component into two or more separate components, and still be within the scope of the present disclosure.

Figure 12:
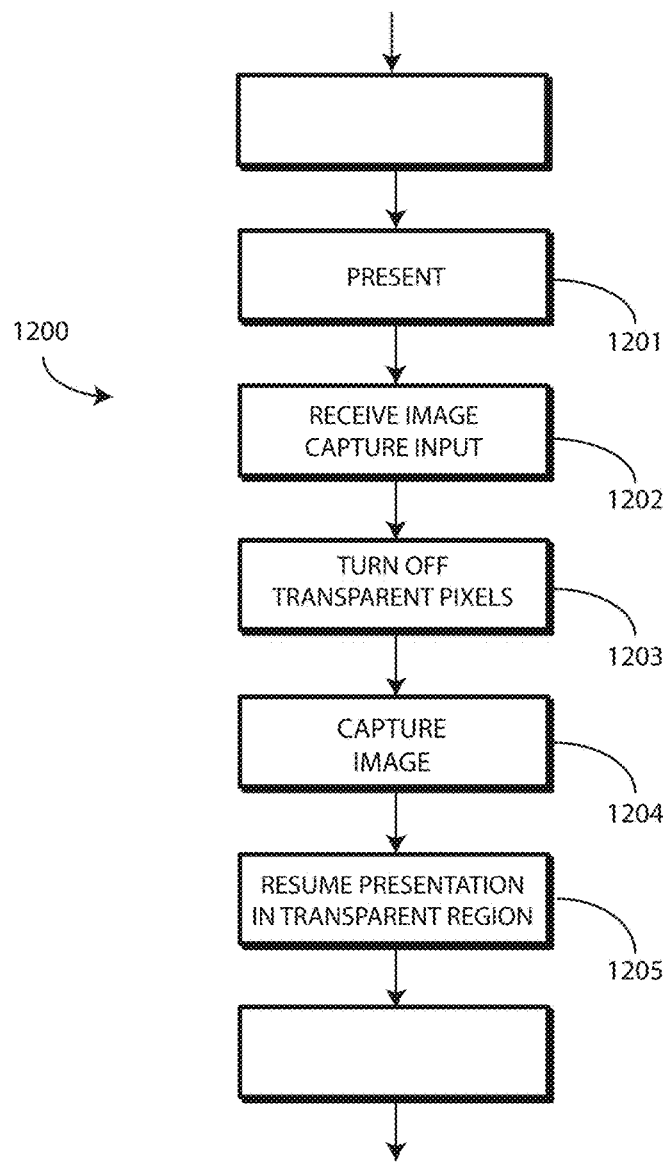
FIG. 12 illustrates one explanatory method in accordance with one or more embodiments of the disclosure.

Now that the various hardware components have been described, attention will be turned to methods, systems, and use cases in accordance with one or more embodiments of the disclosure. Beginning with FIG. 12, illustrated therein is a method 1200 for capturing an image with an imager in accordance with one or more embodiments of the disclosure. While used primarily for capturing images, it should be noted that the steps of the method 1200 could be used for other sensors when receiving signals through transparent organic light emitting diode pixels or sub-pixels as well.

Beginning at step 1201, the method includes presenting content on the display. As shown above in FIG. 10, content can be presented on a first pixel portion comprising only transparent organic light emitting diode pixels or sub-pixels or a combination of transparent organic light emitting diode pixels or sub-pixels and reflective organic light emitting diode pixels or sub-pixels. The content can also be presented on a second pixel portion comprising only reflective organic light emitting diode pixels or sub-pixels.

At step 1202, the method 1200 receives user input directing the imager of an electronic device, disposed beneath and collocated with the first pixel portion, to capture an image. A user may touch a user actuation target, press a button, give a voice command, or deliver other user input to the electronic device at step 1202. Where the method 1200 is being used with another sensor, the one or more processors of the electronic device can direct the sensor to capture information at step 1202.

At step 1203, one or more processors of the electronic device, which are operable with the imager, cause the transparent organic light emitting diode pixels or sub-pixels to cease emitting light. This cessation of light emission prevents light emitted from the transparent organic light emitting diode pixels or sub-pixels from interfering with light incident upon the first pixel portion. As noted above, when the transparent organic light emitting diode pixels or sub-pixels are turned OFF, they become optically transparent.

In some embodiments, the second pixel portion will remain ON during step 1203. However, in other embodiments the second pixel portion will be turned OFF as well.

At step 1204, the method 1200 includes actuating the imager to capture the image from the light passing through the transparent organic light emitting diode pixels or sub-pixels. Where the method 1200 is used with another sensor, step 1204 can include receiving information from signals passing through the transparent organic light emitting diode pixels or sub-pixels. For example, where a proximity detector is placed beneath the first pixel portion, step 1204 can include the proximity detector receiving infrared signals that pass through the transparent organic light emitting diode pixels or sub-pixels.

At step 1205, the method 1200 resumes the presentation of data along the first pixel portion of the display. In one or more embodiments, this comprises actuating the transparent organic light emitting diode pixels or sub-pixels, thereby causing them to again begin emitting light.

Figure 13:
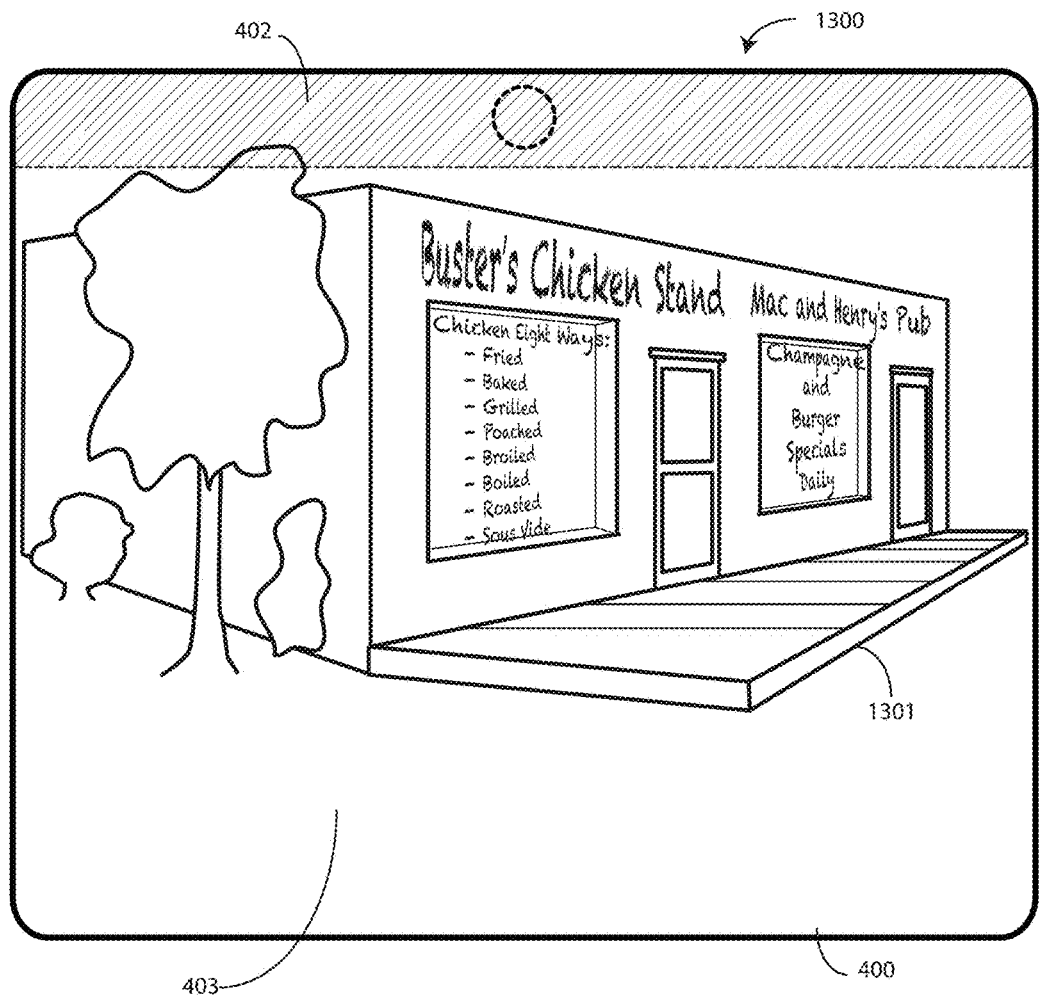
FIG. 13 illustrates one explanatory electronic device in accordance with one or more embodiments of the disclosure.

Turning now to FIG. 13, illustrated therein is an electronic device 1300 that includes a display 400 comprising a substrate defining a first pixel portion 402 and one or more second pixel portions 403. The first pixel portion 402 comprises either only transparent organic light emitting diode pixels or sub-pixels or a combination of transparent organic light emitting diode pixels or sub-pixels and reflective organic light emitting diode pixels or sub-pixels. The one or more second pixel portions 403 include only reflective organic light emitting diode pixels or sub-pixels. As shown, the electronic device 1300 is presenting content 1301, shown here as an image, on both the first pixel portion 402 and the one or more second pixel portions 403.

As noted above, embodiments of the disclosure contemplate that transparent organic light emitting diode display pixels, sub-pixels, or partial sub-pixels can diminish in brightness sooner than do reflective organic light emitting diode display pixels, sub-pixels, or partial sub-pixels. Discoloration can also occur more rapidly in transparent organic light emitting diode pixels or sub-pixels than in reflective organic light emitting diode pixels or sub-pixels. Additionally, transparent organic light emitting diode display pixels, sub-pixels, or partial sub-pixels can suffer from "burn-in" issues more than do their reflective counterparts.

As shown in FIG. 13, one example of this performance degradation 1302 can be seen. As shown in FIG. 13, in response to extended operation, performance degradation 1302 is occurring due to the fact that transparent organic light emitting diode pixels or sub-pixels are used in the first pixel portion 402. In one embodiment, the performance degradation 1302 comprises one or more of a loss of brightness or a discoloration of the first pixel portion 402. In this illustrative example, the performance degradation 1302 causes the first pixel portion 402 to look dimmer and more yellowed than the second pixel portion 403.

Advantageously, embodiments of the disclosure provide methods to remediate the display 400 to compensate performance degradation 1302. It should be noted that "remediation" as this term is used in this disclosure does not mean reversing the performance degradation 1302, as embodiments of the disclosure contemplate that performance degradation 1302 is inevitable in many cases due to the physical structure of the transparent organic light emitting diode pixels or sub-pixels. Accordingly, as used herein, "remediation" refers to executing compensating methods and applying compensating systems to the first pixel portion 402, such as by presenting content, adjusting power levels, tuning color, and/or brightness of the less used portions so that all portions of the display 400 achieve a substantially equivalent visual appearance. Accordingly, a remediated display is not devoid of performance degradation 1302, but instead ensures that any performance degradation 1302 that may occur happens substantially equally along all portions of the display 400.

Figure 14:
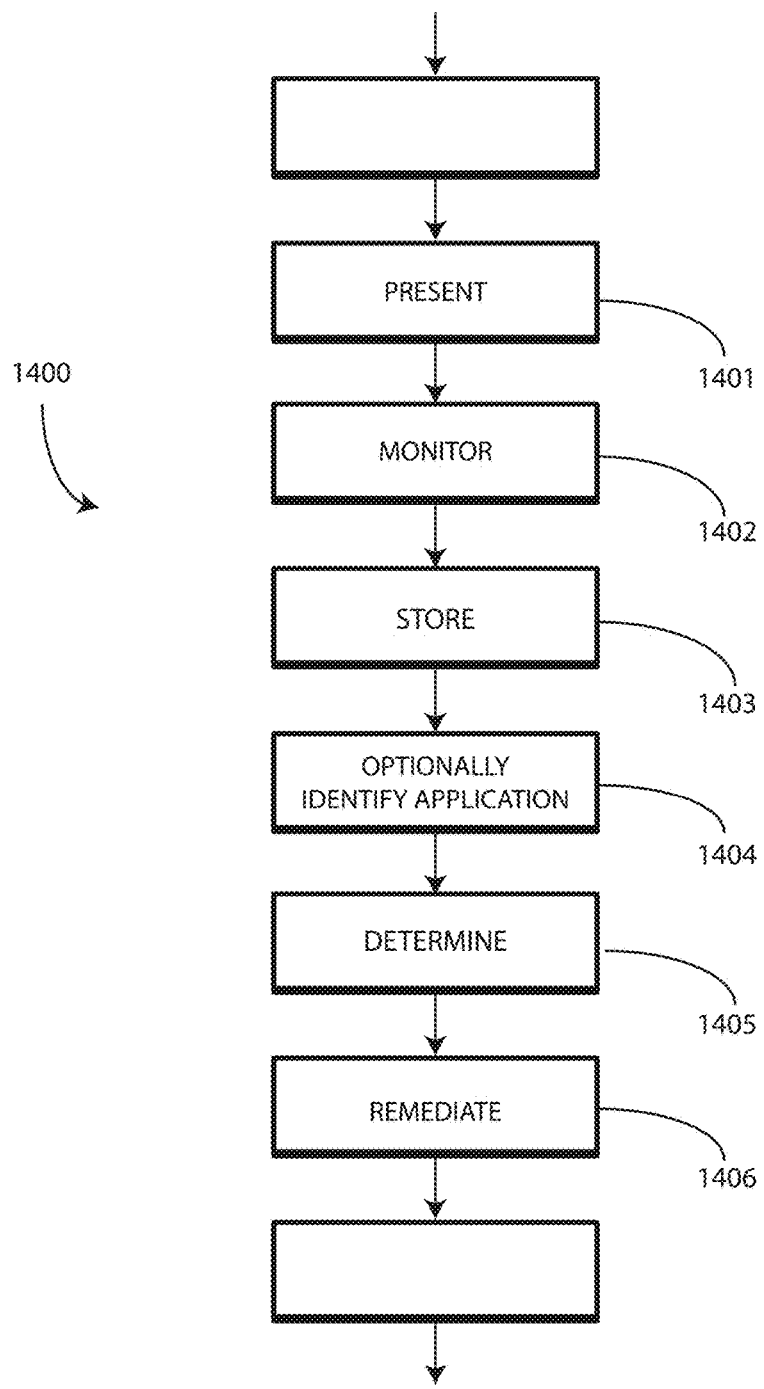
FIG. 14 illustrates one explanatory method in accordance with one or more embodiments of the disclosure.

Turning now to FIG. 14, illustrated therein is one explanatory method 1400 for remediating performance degradation resulting from the presentation of content on a pixel portion comprising transparent organic light emitting diode pixels or sub-pixels while another pixel portion of the display includes reflective organic light emitting diode pixels or sub-pixels.

At step 1401, the method 1400 comprises presenting content on the display. At optional step 1402, the method 1400 includes monitoring a presentation characteristic of the content being presented at step 1401. In one or more embodiments, these presentation characteristics are monitored to estimate the amount of performance degradation occurring while the first pixel portion presents the content. As will be described in more detail below, in one or more embodiments remediation operations that occur in accordance with embodiments of the disclosure occur as a function of the presentation characteristics monitored at step 1402.

In one embodiment, step 1402 includes monitoring an ON time of the first pixel portion of the display while the first pixel portion is presenting content. In another embodiment, step 1402 comprises monitoring a brightness of the first pixel portion of the display while the first pixel portion is presenting content. In still another embodiment, step 1402 comprises monitoring an ON pixel value for pixels of the first pixel portion of the display while the first pixel portion of the display is presenting content. Of course, combinations of these presentation characteristics can be monitored at step 1402 as well. Still other performance characteristics suitable for monitoring at step 1402 will be obvious to those of ordinary skill in the art having the benefit of this disclosure. The monitoring occurring at step 1402 can also include monitoring these values for the one or more second pixel portions so that the monitored values from the first pixel portion and the one or more second pixel portions can be compared.

In one or more embodiments, the presentation characteristics monitored at step 1402 can be stored in a memory device to define a content presentation history at step 1403. For example, in one embodiment, the content presentation history comprises a record of an ON time of the first pixel portion and/or the one or more second pixel portions, a brightness of the first pixel portion and/or the one or more second pixel portions, an ON pixel value of the first pixel portion and/or the one or more second pixel portions, or combinations thereof. Embodiments of the disclosure contemplate that, in some applications, content will be presented on the first pixel portion while in other application's content will be presented on the one or more second pixel portions. Accordingly, across time the storage occurring at step 1403 can define a presentation history that includes a record of an ON time, a brightness, an ON pixel value, or combinations thereof, for the first pixel portion and the one or more second pixel portions, respectively.

At optional step 1404, in one embodiment the method 1400 monitors a type of application causing the presentation of content on the first pixel portion and/or the one or more second pixel portions. As noted above, embodiments of the disclosure contemplate that the amount of burn-in that a portion of a display including transparent organic light emitting diode pixels or sub-pixels experiences can be a function of a particular application operating to cause the presentation of content. For example, an email application that presents black text on an otherwise white display will cause more burn-in that would, say, a gaming application or music application that presents information on a black background. From the example of FIG. 10 above, constantly displaying battery status, time of day, or other information on the first pixel portion may cause more burn-in that would the presentation of changing images on the one or more second pixel portions. Accordingly, in one or more embodiments one or more processors monitor a record of a type of application causing the presentation of content and/or application parameters corresponding to the application at step 1404. In one embodiment, this application recording can be stored to the presentation history at step 1404 as well.

At step 1405, the method 1400 determines that the first pixel portion requires remediation to compensate for performance degradation resulting from the presentation of content with transparent organic light emitting diode pixels or sub-pixels. This determination can be made in a variety of ways. In one simple embodiment, the first pixel portion requires remediation when it has been used more than the one or more second pixel portions. In another embodiment, the presentation history stored in memory can be used to determine when the first pixel portion needs remediation. In another embodiment, monitored presentation characteristics, including an ON time of the first pixel portion and/or the one or more second pixel portions of the display, a brightness of the first pixel portion and/or the one or more second pixel portions of the display, an ON pixel value of the first pixel portion and/or the one or more second pixel portions of the display, or combinations thereof, can be used to determine that the first pixel portion of the display requires remediation to compensate for performance degradation. Still other techniques for making the determination of step 1405 will be obvious to those of ordinary skill in the art having the benefit of this disclosure.

At step 1406, the method 1400 remediates the display. In one or more embodiments, methods of remediating the display to ensure that the first pixel portion and the one or more second pixel portions appear visually similar in appearance.

Illustrating by example, in one or more embodiments one or more processors operable with the display perform color tracking by monitoring how often the portion of the display comprising transparent organic light emitting diode display pixels, sub-pixels, or partial sub-pixels is ON relative to other portions comprising only reflective organic light emitting diode display pixels, sub-pixels, or partial sub-pixels. The one or more processors can calculate and store running averages of this "on pixel ratio" for all areas of the display. The one or more processors can then compensate for differences in this on pixel ratio to ensure consistent optical performance as seen by a viewer.

Examples of how this can occur are explained in more detail below with reference to FIGS. 15-17. Still other methods of remediating the display will be obvious to those of ordinary skill in the art having the benefit of this disclosure.

Figure 15:
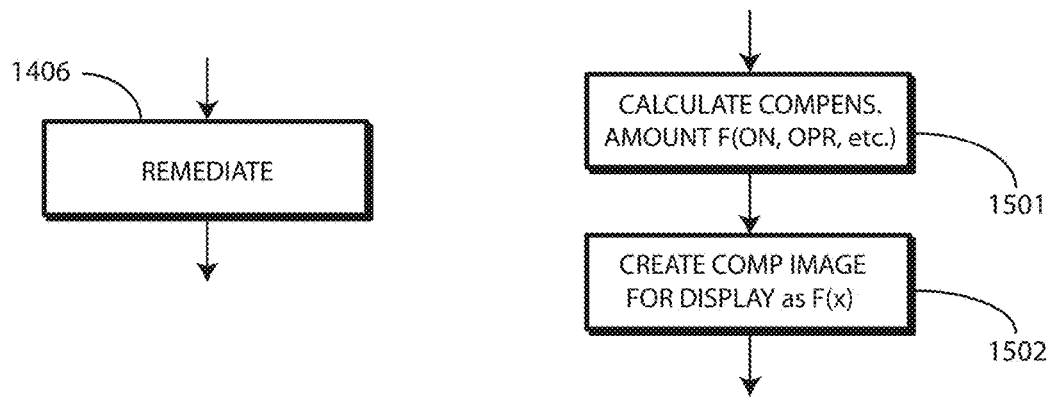
FIG. 15 illustrates one or more method steps in accordance with one or more embodiments of the disclosure.

Beginning with FIG. 15, in one embodiment the remediating occurring at step 1406 comprises monitoring, at step 1501, the content being presented on one of the first pixel portion and/or the one or more second pixel portions of the display and presenting, at step 1502, other content to remediate for any loss of brightness, loss of intensity, or burn-in that may result from the presenting of step 1501. In a simple example, if the first pixel portion constantly displays time of day, battery status, and wireless signal strength, in one embodiment a mirror image of this content can be presented on the first pixel portion of the display at step 1502 to reduce burn-in. In another simple example, where loss of brightness is problematic at the first pixel portion, one or more processors of the electronic device remediate the first pixel portion by increasing an amount of power delivered to at least some of the transparent organic light emitting diode pixels. Other remediation techniques are described below. Still others will be obvious to those of ordinary skill in the art having the benefit of this disclosure.

In one or more embodiments, the content presented at step 1502 is created as a function of the ratio of the amount of time the transparent organic light emitting diode pixels or sub-pixels in the first pixel portion are ON compared with the amount of time that the reflective organic light emitting diode pixels or sub-pixels are ON. This is referred to as the "ON Pixel Ratio." In one or more embodiments the ON Pixel Ratio can be calculated between the first pixel portion and the second pixel portion. In one or more embodiments, the ON Pixel Ratio is determined for each sub-pixel individually when those sub-pixels correspond to different colors. Thus, one ON Pixel Ratio could be calculated for blue sub-pixels, while another is calculated for green sub-pixels, and so forth. The ON Pixel Ratios for the first pixel portion and the second pixel portion can then be analyzed to compensate for differences between the first pixel portion and the second pixel portion so that remedial operations can be taken to balance the visual appearance between the first pixel portion and the second pixel portion. The appropriate compensation image can then be display to the first pixel portion or the second pixel portion as needed.

Figure 16:
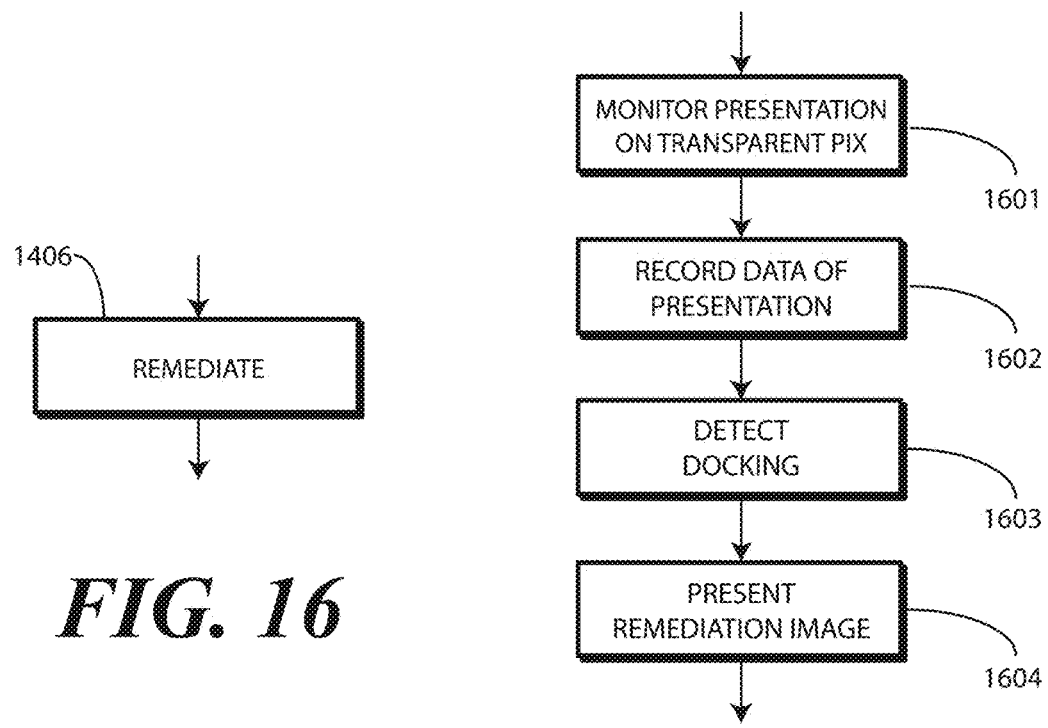
FIG. 16 illustrates one or more method steps in accordance with one or more embodiments of the disclosure.

Turning now to FIG. 16, illustrated therein is another example of how the remediating of step 1406 can occur. Embodiments of the disclosure contemplate that it can be beneficial to perform the remediation only at select, opportune times. For example, where a user is not actively using an electronic device, remediation activities might occur. By contrast, when the user is actively using the electronic device, remediation may be precluded so as not to disrupt the user's usage of the electronic device.

Accordingly, at step 1601 the remediating occurring at step 1406 comprises monitoring the content being presented on the first pixel portion and/or the one or more second pixel portions of the display. At step 1602, presentation characteristics corresponding to the presentation are recorded in memory. These presentation characteristics can include an ON time of the first pixel portion and/or the one or more second pixel portions of the display, a brightness of the first pixel portion and/or the one or more second pixel portions of the display, an ON pixel value for pixels of the first pixel portion and/or the one or more second pixel portions of the display, or other characteristics. In one embodiment, these characteristics are stored in a memory device to define a content presentation history as described above.

At step 1603, a docking operation is detected. Examples of docking operations include coupling the electronic device to a charger or power supply, coupling the electronic device to a docking station, causing the electronic device to enter a docked mode of operation such as presenting a clock for nightstand use, or bending the electronic device into one or more predefined geometrical configurations corresponding to a docked mode. Embodiments of the disclosure contemplate that a user is unlikely to be using the electronic device when in the docket mode.

At step 1604, other content can be presented on the pixel portion that requires remediation. As noted above, this content can be a compensation image that is determined as a function of intensity, color, compensation amount, or other characteristics of the ON Pixel Ratios. In one embodiment, this other content is presented on the display while the electronic device is in the docked mode of operation. The remediating content can be created as a function of the monitored presentation characteristics that causes either the first pixel portion or the one or more second pixel portions to emit brightness, color, and intensities of light so that each pixel portion operates consistently. For instance, a series of flashes, patterns, or other abstract content presentations can exercise the pixels that are seldom used to counteract burn-in. This results in each pixel getting the same amount of ON time, brightness, and/or pixel value.

Figure 17:
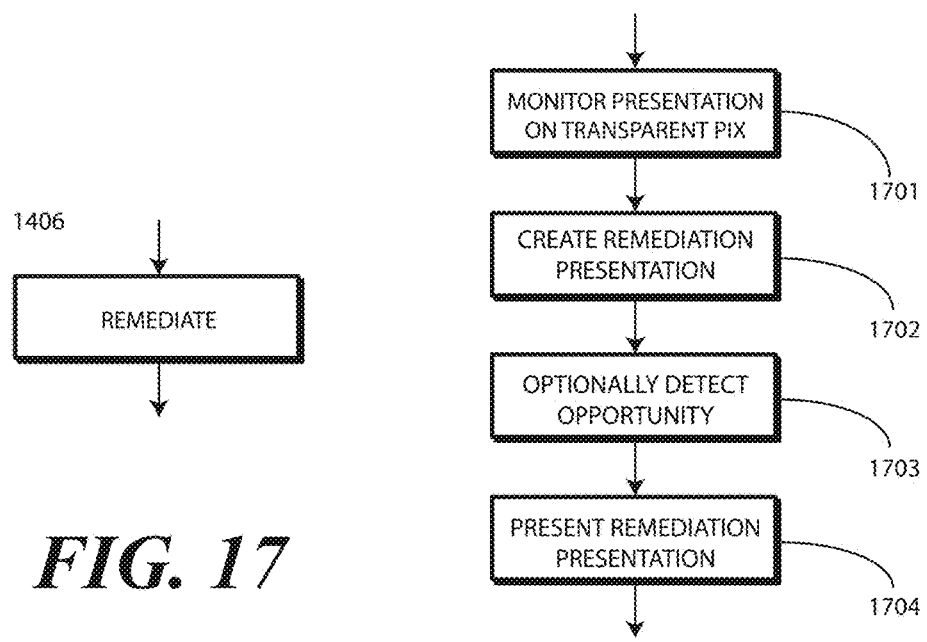
FIG. 17 illustrates one or more method steps in accordance with one or more embodiments of the disclosure.

Turning now to FIG. 17, illustrated therein is another example of how the remediating of step 1406 can occur. At step 1701 the remediating occurring at step 1406 comprises monitoring the content being presented on the first pixel portion and/or the one or more second pixel portions of the display. At step 1702, remediating content is created. In one embodiment, the different content is created as a function of the monitored presentation characteristics that causes one or both of the first pixel portion and/or the one or more second portions to emit brightness, color, and intensities of light so as to mitigate any visible differences occurring between the first pixel portion and the second pixel portion when operating normally.

At step 1303, an opportune moment to perform the remediation is identified. As noted above, embodiments of the disclosure contemplate that it can be beneficial to perform the remediation only at select, opportune times. Examples of such opportune times include times where the electronic device is not moving, as detected by the motion detectors, or is in a low-power or sleep mode. Once such an opportune time is detected, remediation can occur at step 1704 as previously described.

Figure 18:
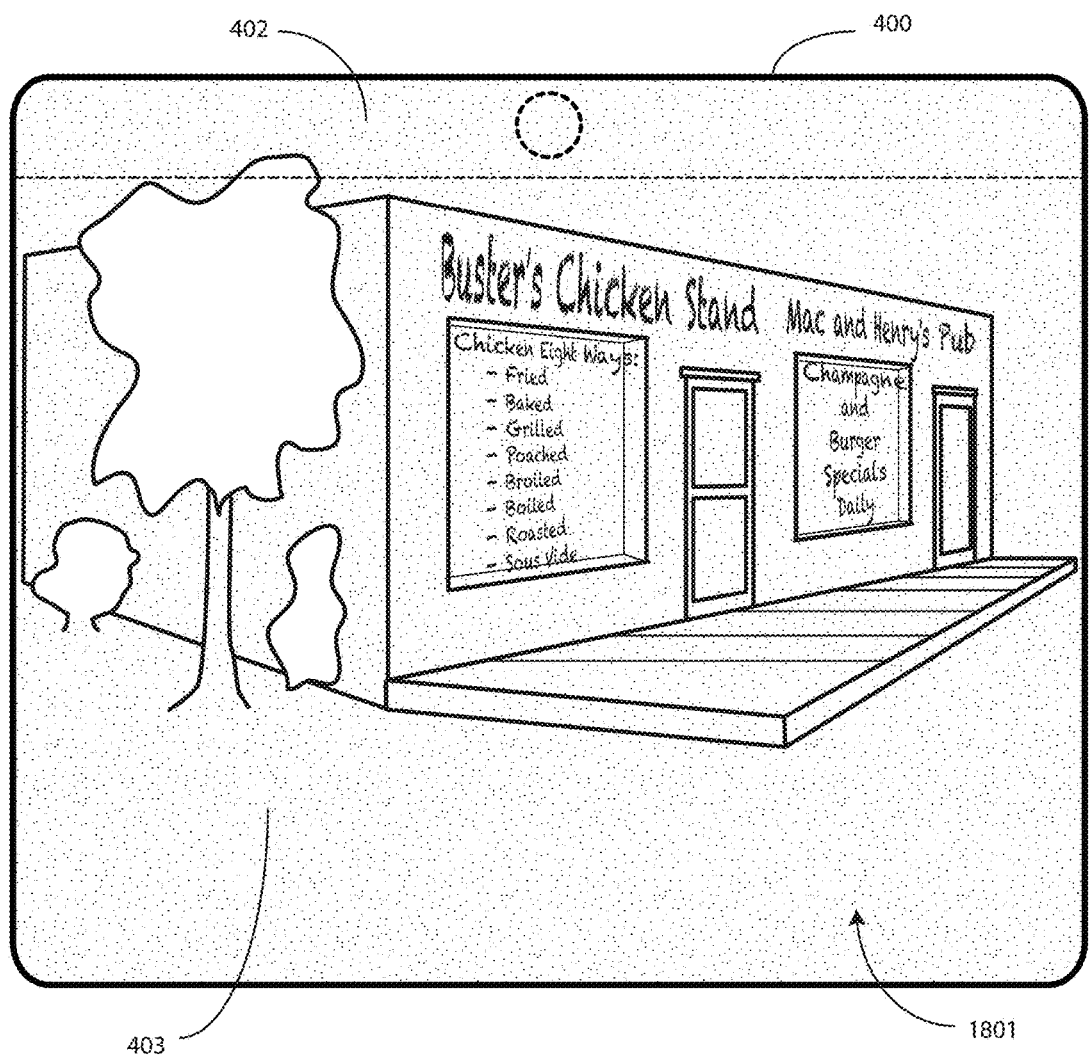
FIG. 18 illustrates another electronic device in accordance with one or more embodiments of the disclosure.

The results of remediation are shown in FIG. 18. As shown in FIG. 18, the electronic some performance degradation 1801 has occurred. However, due to the remediation efforts, the performance degradation 1801 is uniform across the first pixel portion 402 and the one or more second pixel portions 403. The result is achievement of a substantially equivalent visual appearance 1802 across the display 400.

Figure 19:
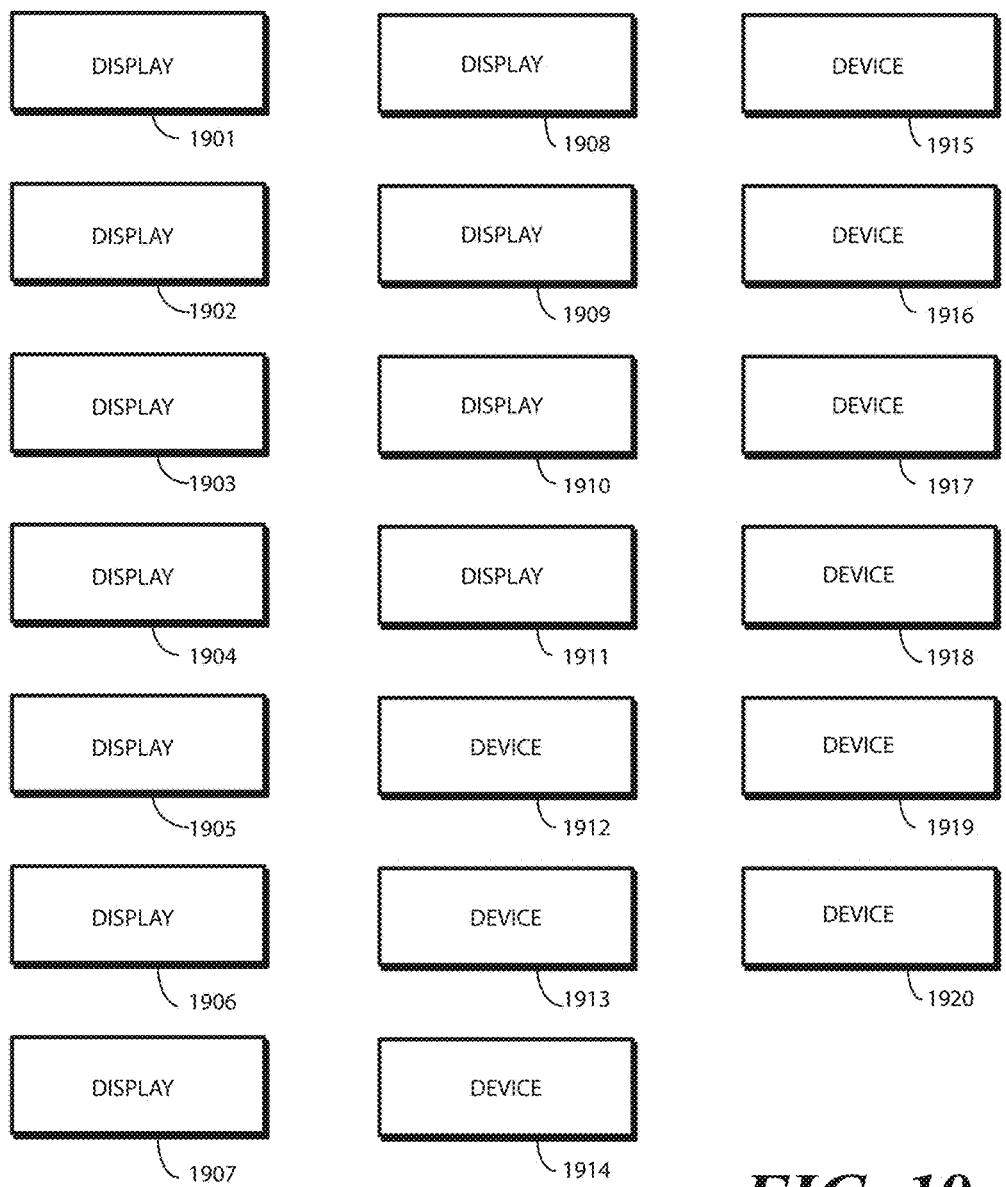
FIG. 19 illustrates one or more embodiments of the disclosure.

Turning now to FIG. 19, illustrated therein are various embodiments of the disclosure. At 1901, an organic light emitting diode display comprises a substrate defining a first pixel portion and one or more second pixel portions. At 1901, pixels formed in the first pixel portion comprise at least some transparent organic light emitting diode pixels, while other pixels formed in the one or more second pixel portions comprise only reflective organic light emitting diode pixels.

At 1902, the first pixel portion of 1901 comprises a combination of the transparent organic light emitting diode pixels and the reflective organic light emitting diode pixels. At 1903, the transparent organic light emitting diode pixels and the reflective organic light emitting diode pixels of the first pixel portion are arranged in an alternating array.

At 1904, the alternating array of 1903 comprises columns of reflective organic light emitting diode pixels alternating with other columns of transparent organic light emitting diode pixels. At 1905, the alternating array comprises a checkerboard array.

At 1906, the transparent organic light emitting diode pixels of 1901 each comprises a plurality of sub-pixels. At 1906, some sub-pixels are transparent and other sub-pixels are reflective.

At 1907, the plurality of sub-pixels of 1906 comprises red sub-pixels, blue sub-pixels, and green sub-pixels. At 1907, the green sub-pixels comprise transparent sub-pixels. At 1908, the red sub-pixels and the blue sub-pixels of 1907 each comprise reflective sub-pixels.

At 1909, the plurality of sub-pixels of 1906 comprises at least two red sub-pixels, at least two blue sub-pixels, and at least two green sub-pixels. At 1909, each of a first red sub-pixel and a first green sub-pixel comprise transparent sub-pixels. At 1909, each of a second red sub-pixel and a second green sub-pixel comprise reflective sub-pixels.

At 1910, the plurality of sub-pixels of 1906 comprises at least two red sub-pixels, at least two blue sub-pixels, and at least two green sub-pixels. At 1910, each of a first red sub-pixel, a first green sub-pixel, and a first blue sub-pixel comprise transparent sub-pixels. At 1910, each of a second red sub-pixel, a second green sub-pixel, and a second blue sub-pixel comprise reflective sub-pixels.

At 1911, an electronic device comprises an organic light emitting diode display comprising a substrate defining a first pixel portion comprising a combination of transparent organic light emitting diode pixels and reflective organic light emitting diode pixels, and at least one second pixel portion comprising only reflective light emitting diode pixels. At 1911, the electronic device also includes an imager. At 1911, the imager is collocated with the first pixel portion so as to receive light through the transparent organic light emitting diode pixels.

At 1912, the transparent organic light emitting diode pixels and the reflective organic light emitting diode pixels of the first pixel portion of 1911 are arranged in an alternating pattern. At 1913, the transparent organic light emitting diode pixels of the first pixel portion of 1911 each comprise a plurality of sub-pixels. At 1913, some sub-pixels are transparent and other sub-pixels are reflective.

At 1914, the electronic device of 1911 further comprises one or more processors operable with the imager. At 1914, the one or more processors cause the transparent organic light emitting diode pixels to cease emitting light while actuating the imager.

At 1915, an electronic device comprises an organic light emitting diode display comprising a substrate defining a first pixel portion comprising transparent organic light emitting diode pixels and one or more second pixel portions comprising only reflective light emitting diode pixels. At 1915, one or more processors are operable with the organic light emitting diode display. At 1915, the one or more processors remediate one or both of the first pixel portion and the one or more second pixel portions to compensate performance degradation of the first pixel portion resulting from the presenting content on the first pixel portion of the organic light emitting diode display.

At 1916, the performance degradation of 1915 comprises one or more of loss of brightness or discoloration of the first pixel portion. At 1917, the one or more processors of 1915 remediating the first pixel portion by increasing an amount of power delivered to at least some of the transparent organic light emitting diode pixels.

At 1918, the one or more processors of 1915 further monitor a presentation characteristic of the content presented. At 1918, remediating occurs as a function of the presentation characteristic.

At 1919, the presentation characteristic of 1918 comprises one or more of an ON time of the first pixel portion, a brightness of the first pixel portion, an ON pixel value of the first pixel portion, or combinations thereof. At 1920, the presentation characteristic of 1919 further comprises one or more of another ON time of the one or more second pixel portions, another brightness of the one or more second pixel portions, another ON pixel value of the one or more second pixel portions, or combinations thereof.

In the foregoing specification, specific embodiments of the present disclosure have been described. However, one of ordinary skill in the art appreciates that various modifications and changes can be made without departing from the scope of the present disclosure as set forth in the claims below. Thus, while preferred embodiments of the disclosure have been illustrated and described, it is clear that the disclosure is not so limited. Numerous modifications, changes, variations, substitutions, and equivalents will occur to those skilled in the art without departing from the spirit and scope of the present disclosure as defined by the following claims. Accordingly, the specification and figures are to be regarded in an illustrative rather than a restrictive sense, and all such modifications are intended to be included within the scope of present disclosure. The benefits, advantages, solutions to problems, and any element(s) that may cause any benefit, advantage, or solution to occur or become more pronounced are not to be construed as a critical, required, or essential features or elements of any or all the claims.

What is claimed is:

1. An organic light emitting diode display comprising a substrate defining a first pixel portion and one or more second pixel portions, wherein pixels formed in the first pixel portion comprise at least some transparent organic light emitting diode pixels, and other pixels formed in the one or more second pixel portions comprise only reflective organic light emitting diode pixels, wherein the first pixel portion comprises a combination of the at least some transparent organic light emitting diode pixels and the reflective organic light emitting diode pixels.

2. The organic light emitting diode display of claim 1, further comprising one or more sensors, collocated with the first pixel portion, so as to receive signals through the at at least some transparent organic light emitting diode pixels.

3. The organic light emitting diode display of claim 1, wherein the transparent organic light emitting diode pixels and the reflective organic light emitting diode pixels of the first pixel portion are arranged in an alternating array.

4. The organic light emitting diode display of claim 3, wherein the alternating array comprises columns of reflective organic light emitting diode pixels alternating with other columns of transparent organic light emitting diode pixels.

5. The organic light emitting diode display of claim 3, wherein the alternating array comprises rows of reflective organic light emitting diode pixels alternating with other rows of transparent organic light emitting diode pixels.

6. The organic light emitting diode display of claim 1, wherein the transparent organic light emitting diode pixels and the reflective organic light emitting diode pixels of the first pixel portion are arranged in a checkerboard array.

7. The organic light emitting diode display of claim 1, wherein the transparent organic light emitting diode pixels each comprise a plurality of sub-pixels, wherein some sub-pixels are transparent and other sub-pixels are reflective.

8. The organic light emitting diode display of claim 7, wherein the plurality of sub-pixels comprises red sub-pixels, blue sub-pixels, and green sub-pixels, wherein the green sub-pixels comprise transparent sub-pixels.

9. The organic light emitting diode display of claim 8, wherein the red sub-pixels and the blue sub-pixels each comprise reflective sub-pixels.

10. The organic light emitting diode display of claim 7, wherein the plurality of sub-pixels comprise at least two red sub-pixels, at least two blue sub-pixels, and at least two green sub-pixels, wherein:
    each of a first red sub-pixel and a first green sub-pixel comprise transparent sub-pixels; and
    each of a second red sub-pixel and a second green sub-pixel comprise reflective sub-pixels.

11. The organic light emitting diode display of claim 7, wherein the plurality of sub-pixels comprise at least two red sub-pixels, at least two blue sub-pixels, and at least two green sub-pixels, wherein:
    each of a first red sub-pixel, a first green sub-pixel, and a first blue sub-pixel comprise transparent sub-pixels; and
    each of a second red sub-pixel, a second green sub-pixel, and a second blue sub-pixel comprise reflective sub-pixels.

12. The organic light emitting diode display of claim 1, the one or more second pixel portions comprising a single pixel portion.

13. The organic light emitting diode display of claim 1, the one or more second pixel portions spanning less area of the organic light emitting diode display than the first pixel portion.

14. An electronic device, comprising:
    an organic light emitting diode display comprising a substrate defining a first pixel portion comprising a combination of transparent organic light emitting diode pixels and reflective organic light emitting diode pixels and at least one second pixel portion comprising only reflective light emitting diode pixels; and
    an imager;
    wherein the imager is collocated with the first pixel portion so as to receive light through the transparent organic light emitting diode pixels.

15. The electronic device of claim 14, wherein the transparent organic light emitting diode pixels and the reflective organic light emitting diode pixels of the first pixel portion are arranged in an alternating pattern.

16. The electronic device of claim 14, wherein the transparent organic light emitting diode pixels of the first pixel portion each comprise a plurality of sub-pixels, wherein some sub-pixels are transparent and other sub-pixels are reflective.

17. The electronic device of claim 14, further comprising one or more processors operable with the imager, the one or more processors causing the transparent organic light emitting diode pixels to cease emitting light while actuating the imager.

18. The electronic device of claim 14, further comprising one or more sensors, collocated with the first pixel portion, so as to receive signals through the transparent organic light emitting diode pixels.

19. The electronic device of claim 14, further comprising a housing supporting the organic light emitting diode display.

20. The electronic device of claim 19, the organic light emitting diode display spanning an entirety of a major face of the electronic device.

* * * * *